United States Patent
Ha et al.

(10) Patent No.: US 10,733,744 B2
(45) Date of Patent: Aug. 4, 2020

(54) LEARNING BASED APPROACH FOR ALIGNING IMAGES ACQUIRED WITH DIFFERENT MODALITIES

(71) Applicant: KLA-Tencor Corporation, Milpitas, CA (US)

(72) Inventors: Thanh Huy Ha, Milpitas, CA (US); Scott A. Young, Soquel, CA (US); Mohan Mahadevan, Livermore, CA (US)

(73) Assignee: KLA-Tencor Corp., Milpitas, CA (US)

( * ) Notice: Subject to any disclaimer, the term of this patent is extended or adjusted under 35 U.S.C. 154(b) by 204 days.

(21) Appl. No.: 15/927,011

(22) Filed: Mar. 20, 2018

(65) Prior Publication Data

US 2018/0330511 A1    Nov. 15, 2018

Related U.S. Application Data

(60) Provisional application No. 62/505,009, filed on May 11, 2017.

(51) Int. Cl.
 *G06K 9/00* (2006.01)
 *G06T 7/30* (2017.01)
 (Continued)

(52) U.S. Cl.
 CPC .......... *G06T 7/30* (2017.01); *G06F 30/00* (2020.01); *G06K 9/6203* (2013.01);
 (Continued)

(58) Field of Classification Search
 None
 See application file for complete search history.

(56) References Cited

U.S. PATENT DOCUMENTS

| 7,570,796 B2 | 8/2009 | Zafar et al. |
| 7,676,077 B2 | 3/2010 | Kulkarni et al. |

(Continued)

FOREIGN PATENT DOCUMENTS

WO    2016/096308    6/2016

OTHER PUBLICATIONS

International Search Report for PCT/US2018/031712 dated Nov. 26, 2018.

(Continued)

*Primary Examiner* — Wei Wen Yang
(74) *Attorney, Agent, or Firm* — Ann Marie Mewherter

(57) ABSTRACT

Methods and systems for aligning images for a specimen acquired with different modalities are provided. One method includes acquiring information for a specimen that includes at least first and second images for the specimen. The first image is acquired with a first modality different than a second modality used to acquire the second image. The method also includes inputting the information into a learning based model. The learning based model is included in one or more components executed by one or more computer systems. The learning based model is configured for transforming one or more of the at least first and second images to thereby render the at least the first and second images into a common space. In addition, the method includes aligning the at least the first and second images using results of the transforming. The method may also include generating an alignment metric using a classifier.

25 Claims, 7 Drawing Sheets

(51) Int. Cl.
  *G06K 9/62* (2006.01)
  *H01J 37/26* (2006.01)
  *G06F 30/00* (2020.01)

(52) U.S. Cl.
  CPC ......... *G06K 9/6247* (2013.01); *G06K 9/6267* (2013.01); *H01J 37/26* (2013.01); *G06K 9/629* (2013.01); *G06T 2207/10061* (2013.01); *G06T 2207/20081* (2013.01); *G06T 2207/20084* (2013.01); *G06T 2207/30148* (2013.01); *H01J 2237/22* (2013.01); *H01J 2237/2801* (2013.01)

(56) References Cited

U.S. PATENT DOCUMENTS

| | | | |
|---|---|---|---|
| 8,126,255 | B2 | 2/2012 | Bhaskar et al. |
| 8,664,594 | B1 | 4/2014 | Jiang et al. |
| 8,692,204 | B2 | 4/2014 | Kojima et al. |
| 8,698,093 | B1 | 4/2014 | Gubbens et al. |
| 8,716,662 | B1 | 5/2014 | MacDonald et al. |
| 9,222,895 | B2 | 12/2015 | Duffy et al. |
| 2002/0158199 | A1 | 10/2002 | Takane et al. |
| 2008/0298719 | A1 | 12/2008 | Sengupta et al. |
| 2009/0198635 | A1 | 8/2009 | Doddi et al. |
| 2014/0168627 | A1* | 6/2014 | Schmitt-Weaver ..... G03F 7/707 355/77 |
| 2015/0278625 | A1* | 10/2015 | Finkbeiner ............. G02B 21/26 348/79 |
| 2015/0324965 | A1 | 11/2015 | Kulkarni et al. |
| 2016/0170311 | A1 | 6/2016 | Schmitt-Weaver et al. |
| 2016/0292840 | A1 | 10/2016 | Konecky |
| 2016/0300125 | A1 | 10/2016 | Barker |
| 2017/0032035 | A1 | 2/2017 | Gao et al. |
| 2017/0061604 | A1 | 3/2017 | Pandev |
| 2017/0140524 | A1 | 5/2017 | Bhaskar et al. |
| 2017/0148226 | A1 | 5/2017 | Zhang et al. |
| 2017/0193400 | A1 | 7/2017 | Bhaskar et al. |
| 2017/0337682 | A1* | 11/2017 | Liao .......................... G06T 7/30 |
| 2018/0268256 | A1* | 9/2018 | Di Febbo ................ G06T 7/246 |
| 2018/0322623 | A1* | 11/2018 | Memo ..................... G06N 3/084 |

OTHER PUBLICATIONS

Gondara, "Medical Image Denoising Using Convolutional Denoising Autoencoders," arXiv:1608.04667v2, Sep. 18, 2016, 6 pages.
Goodfellow et al., "Generative Adversarial Nets," arXiv:1406.2661, Jun. 10, 2014, 9 pages.
Hand et al., "Principles of Data Mining (Adaptive Computation and Machine Learning)," MIT Press, Aug. 1, 2001, 578 pages.
International Search Report for PCT/US2018/031714 dated Aug. 24, 2018.
Isola et al., "Image-to-Image translation with Conditional Adversarial Net," arXiv:1611.07004v2, Nov. 22, 2017, 17 pages.
Jebara, "Discriminative, Generative, and Imitative Learning," MIT Thesis, Feb. 2002, 212 pages.
Kingma et al., "ADAM: A Method for Stochastic Optimization," arXiv:1412.6980v9, Jan. 30, 2017, 15 pages, (published as a conference paper at ICLR 2015, May 2015).
Mirza et al., "Conditional Generative Adversarial Nets," arXiv:1411.1784, Nov. 6, 2014, 7 pages.
Rai-Choudhury, "Handbook of Microlithography, Micromachining, and Microfabrication: vol. 1, Microlithography," IEEE Materials and Devices Series 12, Mar. 14, 1997, 776 pages.
Sugiyama, "Introduction to Statistical Machine Learning," Morgan Kaufmann, Oct. 9, 2015, 534 pages.
Szegedy et al., "Going Deeper with Convolutions," 2015 IEEE Conference on Computer Vision and Pattern Recognition (CVPR), Jun. 2015, 9 pages.

* cited by examiner

LEARNING BASED APPROACH FOR ALIGNING IMAGES ACQUIRED WITH DIFFERENT MODALITIES

BACKGROUND OF THE INVENTION

1. Field of the Invention

The present invention generally relates to methods and systems for using a learning based approach for aligning images acquired with different modalities.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect detects on specimens to drive higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on specimens where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on specimens, metrology processes are used to measure one or more characteristics of the specimens that cannot be determined using currently used inspection tools. For example, metrology processes are used to measure one or more characteristics of specimens such as a dimension (e.g., line width, thickness, etc.) of features formed on the specimens during a process such that the performance of the process can be determined from the one or more characteristics. In addition, if the one or more characteristics of the specimens are unacceptable (e.g., out of a predetermined range for the characteristic(s)), the measurements of the one or more characteristics of the specimens may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on specimens may be independent of the results of an inspection process performed on the specimens. In particular, the locations at which a metrology process is performed may be selected independently of inspection results.

As described above, therefore, different information may be generated for a single specimen. This information may include design information for the specimen (i.e., information for a design of devices being formed on the specimen), optical image(s) generated for the specimen by one or more tools (e.g., an inspection tool), electron beam image(s) generated for the specimen by one or more tools (e.g., a defect review tool), etc. It can sometimes be helpful to use a combination of different information to perform one or more processes on or for the specimen and/or to determine further information for the specimen. For example, it may be helpful to have optical and electron beam images corresponding to a single location within a design of a specimen to help diagnose a problem identified in that location within the design.

Using different types of information for a specimen in combination therefore requires some mapping of one type of information to another. Oftentimes, currently, such mapping may be performed by aligning different images generated for a specimen to each other (e.g., using alignment features in the images and/or on the specimen and/or aligning the different images to a common reference (e.g., design)). However, due to differences between the different types of information (e.g., different resolutions, pixel sizes, imaging methods (such as optical vs. electron beam), etc.), alignment of one type of information to another to establish a mapping between the different types of information can be relatively difficult and is susceptible to errors in the alignment method and/or algorithm and noise sources on the specimen (e.g., color variation).

Currently used methods for multi-modality image registration have two main approaches: heuristic rendering followed by currently used registration methods such as normalized cross correlation (NCC), mutual information, phase correlation, etc. and physics-based rendering. In heuristic rendering approaches, there is normally a pipeline of heuristic steps to either extract hand-crafted common features of the two images or to modify one image acquired from one modality to make it look similar to the other for registration. The physics-based approaches often employ physics-based simulation models to transform images from different modality domains to a common domain for registration.

Both heuristic rendering and physics-based approaches have, however, a number of disadvantages. For example, the disadvantages of the currently used heuristic rendering approaches come from their heuristic nature. Most of the challenges in multi-modality image registration are substantially hard to solve completely using heuristic rendering methods. For example, missing computer aided design (CAD) layer issues, context dependent optical proximity correction (OPC) errors, non-uniformity, etc. are difficult to solve using heuristic methods. As design rules continue shrinking, these challenges will become more and more severe.

Moreover, when there is a new challenge such as a new type of imaging artifact, new context of patterns in design, a new type of proximity error, etc., the currently used heuristic approaches may require the developer to have domain expertise to tweak or even add a new algorithm to handle the new challenge. This disadvantage makes the method less reliable and creates a huge burden on developers for algorithm support afterward. In addition, tweaking or adding algorithms whenever there are new challenges coming will undesirably grow complexity of the method, make it hard to use, and greatly impact throughput.

The physics-based approaches rely on imaging simulation models to render images and thus are hardware dependent. Whenever the hardware of the imaging system changes, the imaging simulation model of these methods need to be updated or even re-derived accordingly. Normally, deriving a simulation model for an imaging system is challenging. Moreover, in many systems such as in SEM, imaging simulation models are substantially complex and computationally expensive, which make the approach not practical for run-time use cases.

In addition to imaging simulation models, the physics-based approach may require some additional simulation models which may not be available. For example, in SEM-to-CAD registration use cases, the physics-based approaches will need the simulation of the lithographical process from post-OPC-CAD to actual patterns on wafers to simulate lithographical OPC errors which are substantially significant in high resolution SEM images. In most of the cases, these simulation models are not publicly available due to confidentiality.

Because of their heuristic nature, the currently used heuristic rendering approaches often have many steps that were developed to handle challenges specific to each imaging platform. On the other hand, the physics-based approaches are even much more platform dependent as these methods primarily rely on imaging simulation models as well as assumptions that are specific for each imaging system. This disadvantage limits the benefits of knowledge sharing between different imaging platforms as well as between different product lines.

Accordingly, it would be advantageous to develop systems and methods for aligning images for a specimen acquired with different modalities to each other that do not have one or more of the disadvantages described above.

SUMMARY OF THE INVENTION

The following description of various embodiments is not to be construed in any way as limiting the subject matter of the appended claims.

One embodiment relates to a system configured to align images for a specimen acquired with different modalities. The system includes one or more computer subsystems configured for acquiring information for a specimen. The information includes at least first and second images for the specimen. The first image is acquired with a first modality different from a second modality used to acquire the second image. The system also includes one or more components executed by the one or more computer subsystems. The one or more components include a learning based model. The one or more computer subsystems are configured to input the information for the specimen into the learning based model. The learning based model is configured for transforming one or more of the at least first and second images to thereby render the at least first and second images into a common space. The one or more components are configured for aligning the at least the first and second images using results of the transforming. The system may be further configured as described herein.

Another embodiment relates to a computer-implemented method for aligning images for a specimen acquired with different modalities. The method includes acquiring information for a specimen that includes at least first and second images for the specimen. The first image is acquired with a first modality different than a second modality used to acquire the second image. The method also includes inputting the information for the specimen into a learning based model. The learning based model is included in one or more components executed by one or more computer systems. The learning based model is configured for transforming one or more of the at least first and second images to thereby render the at least first and second images into a common space. In addition, the method includes aligning the at least the first and second images using results of the transforming.

Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on one or more computer systems for performing a computer-implemented method for aligning images for a specimen acquired with different modalities. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
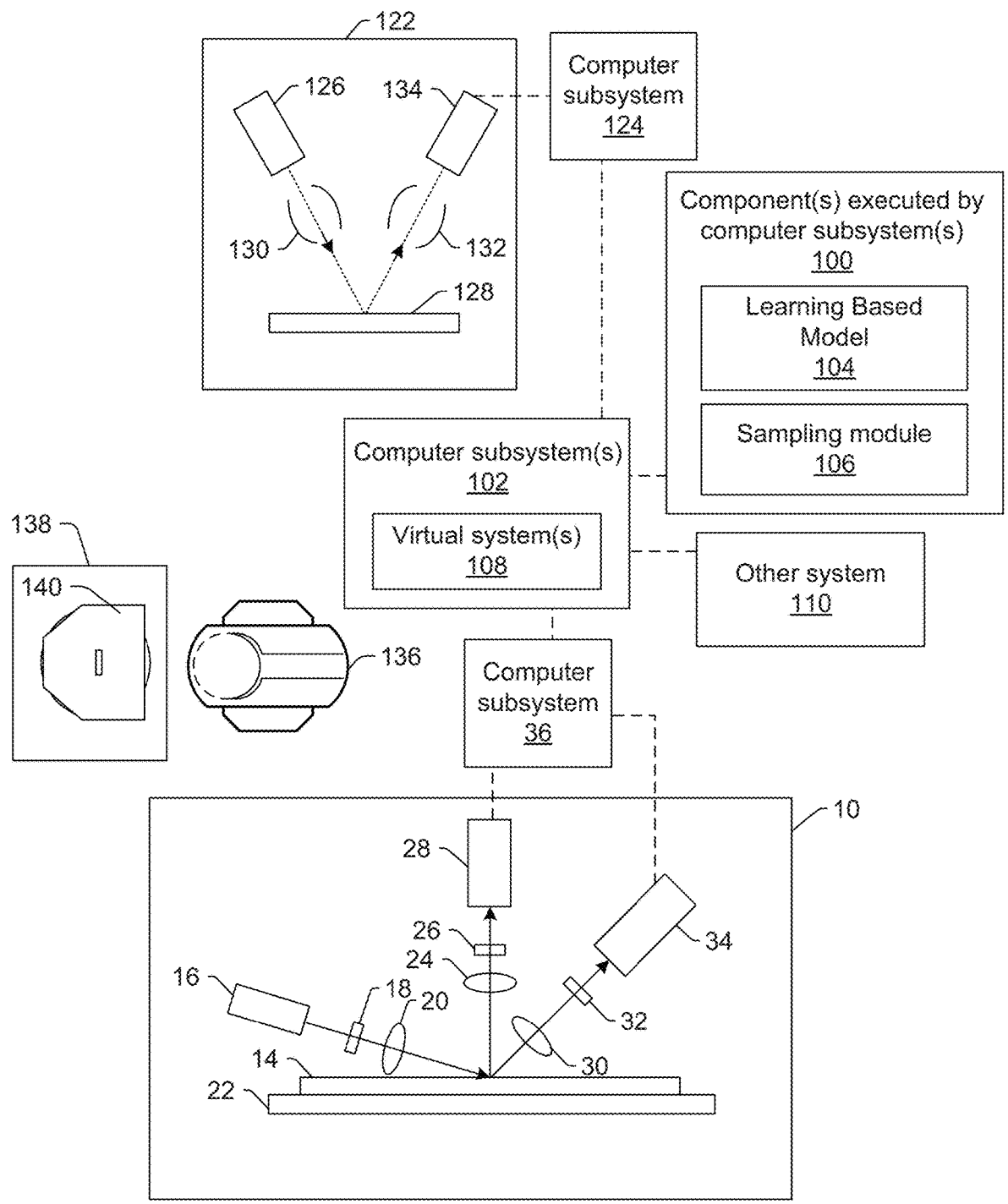
FIG. 1 is a schematic diagram illustrating a side view of an embodiment of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

The terms "design," "design data," and "design information" as used interchangeably herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design, Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In addition, the "design," "design data," and "design information" described herein refers to information and data that is generated by semiconductor device designers in a design process and is therefore available for use in the embodiments described herein well in advance of printing of the design on any physical specimens such as reticles and wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

In general, the embodiments described herein are configured as robust learning based approaches that substantially accurately align images across different modalities, which may have some combination of varying length scales, frequency spreads, differing structures, and large shape distortions. One embodiment relates to a system configured to align images for a specimen acquired with different modalities. One such embodiment is shown in FIG. 1. The system may include optical tool 10, also referred to herein as an "optical imaging system." In general, the optical tool is configured for generating optical images of a specimen by directing light to (or scanning light over) and detecting light from the specimen. In one embodiment, the specimen includes a wafer. The wafer may include any wafer known in the art. In another embodiment, the specimen includes a reticle. The reticle may include any reticle known in the art.

In the embodiment of the system shown in FIG. 1, optical tool 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen.

The optical tool may be configured to direct the light to the specimen at different angles of incidence at different times. For example, the optical tool may be configured to alter one or more characteristics of one or more elements of the illumination subsystem such that the light can be directed to the specimen at an angle of incidence that is different than that shown in FIG. 1. In one such example, the optical tool may be configured to move light source 16, optical element 18, and lens 20 such that the light is directed to the specimen at a different oblique angle of incidence or a normal (or near normal) angle of incidence.

In some instances, the optical tool may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing the light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the optical tool may be configured to alter one or more of the elements of the illumination subsystem based on the type of illumination to be used for generating the optical images.

The optical tool may also include a scanning subsystem configured to cause the light to be scanned over the specimen. For example, the optical tool may include stage 22 on which specimen 14 is disposed during optical imaging. The scanning subsystem may include any suitable mechanical and/or robotic assembly (that includes stage 22) that can be configured to move the specimen such that the light can be scanned over the specimen. In addition, or alternatively, the optical tool may be configured such that one or more optical elements of the optical tool perform some scanning of the light over the specimen. The light may be scanned over the specimen in any suitable fashion such as in a serpentine-like path or in a spiral path.

The optical tool further includes one or more detection channels. At least one of the one or more detection channels includes a detector configured to detect light from the specimen due to illumination of the specimen by the tool and to generate output responsive to the detected light. For example, the optical tool shown in FIG. 1 includes two detection channels, one formed by collector 24, element 26, and detector 28 and another formed by collector 30, element 32, and detector 34, As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected).

As further shown in FIG. 1, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the optical tool that includes two detection channels, the optical tool may include a different number of detection channels (e.g., only one detection channel or two or more detection channels). In one such instance, the detection channel formed by collector 30, element 32, and detector 34 may form one side channel as described above, and the optical tool may include an additional detection channel (not shown) formed as another side channel that is positioned on the opposite side of the plane of incidence. Therefore, the optical tool may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the optical tool may also include two or more side channels configured as described above. As such, the optical tool may include at least three channels (i.e., one top channel and two side channels), and each of the at least three channels has its own collector, each of which is configured to collect light at different scattering angles than each of the other collectors.

As described further above, each of the detection channels included in the optical tool may be configured to detect scattered light. Therefore, the optical tool shown in FIG. 1 may be configured for dark field (DF) imaging of specimens. However, the optical tool may also or alternatively include detection channel(s) that are configured for bright field (BF) imaging of specimens. In other words, the optical tool may include at least one detection channel that is configured to detect light specularly reflected from the specimen. Therefore, the optical tools described herein may be configured for only DF, only BF, or both DF and BF imaging. Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical tool may be signals or data, but not image signals or image data. In such instances, a computer subsystem such as computer subsystem 36 may be configured to generate images of the specimen from the non-imaging output of the detectors. However, in other instances, the detectors may be configured as imaging detectors that are configured to generate imaging signals or image data. Therefore, the optical tool may be configured to generate optical images described herein in a number of ways.

It is noted that FIG. 1 is provided herein to generally illustrate a configuration of an optical tool that may be included in the system embodiments described herein or that may generate optical images that are used by the embodiments described herein. Obviously, the optical tool configuration described herein may be altered to optimize the performance of the optical tool as is normally performed when designing a commercial optical tool. In addition, the systems described herein may be implemented using an existing system (e.g., by adding functionality described herein to an existing system) such as the 29xx/39xx and Puma 9xxx series of tools that are commercially available from KLA-Tencor, Milpitas, Calif. For some such systems, the embodiments described herein may be provided as optional functionality of the system (e.g., in addition to other functionality of the system). Alternatively, the optical tool described herein may be designed "from scratch" to provide a completely new optical tool.

Computer subsystem 36 coupled to the optical tool may be coupled to the detectors of the optical tool in any suitable manner (e.g., via one or more transmission media, which may include "wired" and/or "wireless" transmission media) such that the computer subsystem can receive the output generated by the detectors for the specimen. Computer subsystem 36 may be configured to perform a number of functions described further herein using the output of the detectors.

The computer subsystems shown in FIG. 1 (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 as shown by the dashed line in FIG. 1 by any suitable transmission media, which may include any suitable wired and/or wireless transmission media known in the art, Two or more of such computer subsystems may also be effectively coupled by a shared computer-readable storage medium (not shown).

The system may also include an electron beam tool, also referred to herein as "an electron beam imaging system," configured for generating electron beam images of the specimen by directing electrons to (or scanning electrons over) and detecting electrons from the specimen. In one such embodiment shown in FIG. 1, the electron beam tool includes electron column 122, which may be coupled to computer subsystem 124.

As also shown in FIG. 1, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective tens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam tool may be configured to use multiple modes to generate electron beam images of the specimen as described further herein (e.g., with different illumination angles, collection angles, etc.). The multiple modes of the electron beam tool may be different in any imaging parameters of the electron beam tool.

Computer subsystem 124 may be coupled to detector 134 as described above. The detector may detect electrons returned from the surface of the specimen thereby forming electron beam output and/or images of the specimen. The electron beam output and/or images may include any suitable electron beam output and/or images. Computer subsystem 124 may be configured to perform one or more functions described further herein for the specimen using output generated by detector 134. Computer subsystem 124 may be configured to perform any additional step(s) described herein.

It is noted that FIG. 1 is provided herein to generally illustrate a configuration of an electron beam tool that may be included in the embodiments described herein. As with the optical tool described above, the electron beam tool configuration described herein may be altered to optimize the performance of the electron beam tool as is normally performed when designing a commercial electron beam tool. In addition, the systems described herein may be implemented using an existing system (e.g., by adding functionality described herein to an existing system) such as the eSxxx and eDR-xxxx series of tools that are commercially available from KLA-Tencor. For some such systems, the embodiments described herein may be provided as optional functionality of the system (e.g., in addition to other functionality of the system). Alternatively, the system described herein may be designed "from scratch" to provide a completely new system.

In the embodiments described herein, the optical and electron beam tools may or may not be coupled to each other in a variety of different ways. For example, in one embodiment, the optical tool and the electron beam tool are only coupled to each other via the one or more computer subsystems. In one such example, as shown in FIG. 1, optical tool 10 may be coupled to electron column 122 of the electron beam tool via only computer subsystem 36, computer subsystem(s) 102, and computer subsystem 124. Therefore, computer subsystem(s) 102 may be common to the optical tool and the electron beam tool. In this manner, the electron beam tool and the optical tool may not necessarily be directly connected to each other except for data sharing, which may be facilitated by computer subsystem(s) 102 and/or virtual system(s) 108. As such, the electron beam and optical tools may not be directly connected to each other except for data sharing.

In another embodiment, the optical tool and the electron beam tool are only coupled to each other via the one or more computer subsystems and a common specimen handling subsystem. For example, the optical and electron beam based tools may be coupled by the computer subsystem(s) as described above. In addition, the optical tool and the electron beam tool may share common specimen handling system 136 and possibly load module 138, in which cassette 140 of specimens may be disposed. In this manner, specimens can come into a load module that is common to the optical and electron beam tools, where they can be dispositioned to either (or both) of an optical tool or an electron beam tool. The specimens can also be moved substantially quickly between the electron beam and optical tools.

In general, however, the optical tool may be coupled to the electron beam tool by a common housing (not shown), common specimen handling system 136, a common power source (not shown), computer subsystem(s) 102, or some combination thereof. The common housing may have any suitable configuration known in the art. For example, a housing may be configured to accommodate the optical tool as well as the electron beam tool. In this manner, the optical tool and the electron beam tool may be configured as a single unit or tool. The common specimen handling system may include any suitable mechanical and/or robotic assembly known in the art. The common specimen handling system may be configured to move the specimens between the optical tool and the electron beam tool in such a way that a specimen can be moved from the optical tool directly into the electron beam tool (or vice versa) without having to put the specimen back into its cassette or other container between the processes. The common power source may include any suitable power source known in the art.

The system may be configured as a cluster of modules (or subsystems) that may each be configured to perform different processes. The load module may be configured to support multiple specimens such as cassette 140 of wafers that are to be processed in the system. Robotic specimen handling system 136 may be configured to remove a specimen from the load module prior to measurement and/or inspection and to dispose a processed specimen into the load module. In this manner, common specimen handling system 136, a stage (not shown), or another suitable mechanical device may be configured to move a specimen to and from the optical tool and the electron beam tool.

The systems described herein may also include one or more additional tools (not shown) configured to generate other output for the specimen such as an ion beam-based tool. Such a tool may be configured as shown in FIG. 1 with respect to the electron beam tool except that the electron beam source may be replaced with any suitable ion beam source known in the art. In addition, the tool may be any other suitable ion beam tool such as those included in commercially available focused ion beam (FIB) systems, helium ion microscopy (HIM) systems, and secondary ion mass spectroscopy (SIMS) systems.

The system includes one or more computer subsystems, e.g., computer subsystem(s) 102 shown in FIG. 1, that may be configured for receiving the optical and electron beam images generated for the specimen. For example, as shown in FIG. 1, computer subsystem(s) 102 may be coupled to computer subsystem 36 and computer subsystem 124 such that computer subsystem(s) 102 can receive the optical images or output generated by detectors 28 and 34 and electron beam images or output generated by detector 134. Although the computer subsystem(s) may receive the optical images or output and the electron beam images or output from other computer subsystems coupled to the optical and electron beam tools, the computer subsystem(s) may be configured to receive the optical and electron beam images or output directly from the detectors that generate the images or output (e.g., if computer subsystems) 102 are coupled directly to the detectors shown in FIG. 1).

As noted above, the optical and electron beam tools may be configured for directing energy (e.g., light, electrons) to and/or scanning energy over a physical version of the specimen thereby generating actual (i.e., not simulated) output and/or images for the physical version of the specimen. In this manner, the optical and electron beam tools may be configured as "actual" tools, rather than "virtual" tools. Computer subsystem(s) 102 shown in FIG. 1 may, however, include one or more "virtual" systems 108 that are configured for performing one or more functions using at least some of the actual optical images and/or the actual electron beam images generated for the specimen, which may include any of the one or more functions described further herein.

The one or more virtual systems are not capable of having the specimen disposed therein. In particular, the virtual system(s) are not part of optical tool 10 or electron beam tool 122 and do not have any capability for handling the physical version of the specimen. In other words, in a system configured as a virtual system, the output of its one or more "detectors" may be output that was previously generated by one or more detectors of an actual tool and that is stored in the virtual system, and during the "imaging and/or scanning," the virtual system may replay the stored output as though the specimen is being imaged and/or scanned. In this manner, imaging and/or scanning the specimen with a virtual system may appear to be the same as though a physical specimen is being imaged and/or scanned with an actual system, while, in reality, the "imaging and/or scanning" involves simply replaying output for the specimen in the same manner as the specimen may be imaged and/or scanned.

Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

As further noted above, the optical tool may be configured to generate output for the specimen with multiple modes or "different modalities." In this manner, in some embodiments, the optical images include images generated by the optical tool with two or more different values of a parameter of the optical tool. In general, a "mode" or "modality" (as those terms are used interchangeably herein) of the optical tool can be defined by the values of parameters of the optical tool used for generating output and/or images for a specimen. Therefore, modes that are different may be different in the values for at least one of the optical parameters of the tool. For example, in one embodiment of an optical tool, at least one of the multiple modes uses at least one wavelength of the light for illumination that is different from at least one wavelength of the light for illumination used for at least one other of the multiple modes. The modes may be different in the illumination wavelength as described further herein (e.g., by using different light sources, different spectral filters, etc.) for different modes. In another embodiment, at least one of the multiple modes uses an illumination channel of the optical tool that is different from an illumination channel of the optical tool used for at least one other of the multiple modes. For example, as noted above, the optical tool may include more than one illumination channel. As such, different illumination channels may be used for different modes.

In a similar manner, the electron beam images may include images generated by the electron beam tool with two or more different values of a parameter of the electron beam tool. For example, the electron beam tool may be configured to generate output for the specimen with multiple modes or "different modalities." The multiple modes or different modalities of the electron beam tool can be defined by the values of parameters of the electron beam tool used for generating output and/or images for a specimen. Therefore, modes that are different may be different in the values for at least one of the electron beam parameters of the tool. For example, in one embodiment of an electron beam tool, at least one of the multiple modes uses at least one angle of incidence for illumination that is different from at least one angle of incidence of the illumination used for at least one other of the multiple modes.

The optical and electron beam tools described herein may be configured as inspection tools. In addition, or alternatively, the optical and electron beam tools described herein may be configured as defect review tools. Furthermore, the optical and electron beam tools described herein may be configured as metrology tools. In particular, the embodiments of the optical and electron beam tools described herein and shown in FIG. 1 may be modified in one or more parameters to provide different imaging capability depending on the application for which they will be used. In one such example, the optical tool shown in FIG. 1 may be configured to have a higher resolution if it is to be used for defect review or metrology rather than for inspection. In other words, the embodiments of the optical and electron beam tools shown in FIG. 1 describe some general and various configurations for optical and electron beam tools that can be tailored in a number of manners that will be obvious to one skilled in the art to produce imaging tools having different imaging capabilities that are more or less suitable for different applications.

In some embodiments, the computer subsystem(s) are configured for receiving information for the specimen generated by another system, the computer subsystem(s) or the one or more virtual systems are configured for storing the information, and one or more functions described herein may be performed based on the stored information in combination with other information described herein. For example, as shown in FIG. 1, computer subsystem(s) 102 may be coupled to other system 110 such that the computer subsystem(s) can receive information from the other system. The other system may include a variety of other systems such as an electronic design automation (EDA) tool, another computer system, which may be configured for a variety of different capabilities, another imaging system, another quality control type system, etc. The information for the specimen may include a variety of information for the specimen such as information related to the design for the specimen, images generated by one or more inspection, measurement, or other quality control processes performed on the specimen or another specimen of the same or different type, results of simulations generated for the specimen, information generated for the specimen from another source, etc. In this manner, the embodiments described herein can access and acquire a variety of information that can be used in a number of different steps described herein.

In some such examples, the other system may include an EDA tool. In this manner, the embodiments described herein may have an added dimension of leveraging data generated with EDA computer aided design (CAD) tools. The EDA tool may include any suitable commercially available EDA tool.

The one or more computer subsystems (e.g., computer subsystem(s) 36, 102, and 124 shown in FIG. 1) included in the system are configured for acquiring information for a specimen. The information for the specimen includes at least first and second images for the specimen. In the case of actual images, the computer subsystem may be configured for acquiring the actual images by using one or more of the tools described herein for directing energy (e.g., light or electrons) to a specimen and detecting energy (e.g., light or electrons) from the specimen. Therefore, acquiring the actual images may include generating the images using a physical version of the specimen and some sort of imaging hardware. However, acquiring the actual images may include acquiring the actual images from a storage medium (including any of the storage media described herein) in which the actual images have been stored by an actual imaging system (e.g., optical tool 10). In addition, in the case of design data, the computer subsystem(s) may acquire the design data from a storage medium or another system (e.g., system 110) or may generate the design data itself thereby acquiring the design data.

The first image is acquired with a first modality different from a second modality used to acquire the second image. The first and second modalities may include a variety of different modalities described further herein. The embodiments described herein can be performed for such different modalities because the embodiments are data driven rather than physics simulation based and/or heuristic. In particular, depending on the different modalities that the embodiments will be used for, data corresponding to those modalities can be used as described herein to train the embodiments such that the embodiments learn the transformations between the different modalities thereby rendering the embodiments suitable for the different modalities. As such, the embodiments described herein provide significant flexibility compared to the currently used methods for aligning images from different modalities.

The different modalities are different in at least one imaging parameter of at least one imaging system. In one embodiment, the first and second modalities generate the first and second images with different pixel sizes. For example, the first and second images may be acquired with different scales and resolutions due to differences in the modalities. In this manner, the first and second images may be generated with different pixel sizes. In another embodiment, the first and second modalities generate the first and second images with different frequency spreads. For example, the first and second images may be acquired with different wavelength ranges (or frequency spreads as wavelength and frequency are closely related) of beams. In one such example, an image captured using an optical imaging system and an image captured using an electron beam imaging system are captured at different frequencies.

In an additional embodiment, the first and second modalities generate the first and second images with different distortions of patterned features formed on the specimen. For example, the patterned features in the first and second images may be distorted differently, and in the case of CAD to scanning electron microscope (SEM) alignment, some CAD layers may be missing from the SEM images to which they are being aligned. In another example, a CAD image might have substantially little patterned feature distortion, while a SEM image may have more patterned feature distortion, and an optical image might have the most patterned feature distortion. However, the differences between the amount of distortion in different images of the same patterned features may vary from that described above as well. In this manner, the embodiments described herein provide a robust learning based approach to accurately align images across varying length scales, frequency spreads, different structures, and large shape distortions.

In some embodiments, the first and second modalities are different modalities of the same imaging system. For example, the first and second modalities may be different modalities of an optical imaging system, which may be configured as described further herein. In another example, the first and second modalities may be different modalities of an electron beam imaging system, which may be configured as described herein. In this manner, the first and second modalities may be different in one or more parameters of the same imaging system. In another embodiment, the first and second modalities are different modalities of the same type of imaging system. For example, the first and second modalities may be different modalities of different optical imaging systems, which are the same type in that they are optical systems. In one such example, the first modality may be a modality of a low resolution optical imaging system, and the second modality may be a modality of a high resolution optical imaging system. In an additional example, the first modality may be a modality of an optical inspection system, and the second modality may be a modality of an optical metrology system. In another example, the first modality may be a modality of a first optical imaging system, and the second modality may be a modality of a second optical imaging system that is of the same make and model as the first optical imaging system. Such first and second modalities may also be applicable to other types of imaging systems described herein. In a further embodiment, the first and second modalities are modalities of different types of imaging systems. For example, the first modality may be a modality of an optical imaging system, and the second modality may be a modality of an electron beam imaging system. Such first and second modalities are also applicable to the other imaging systems described herein.

In one embodiment, the first modality includes scanning electron microscopy (SEM), and the second modality includes computer aided design (CAD). These modalities may be further configured as described herein. In the case of SEM as a modality, that term is defined herein as any mode or modality of any of the electron beam imaging systems described herein. In the case of CAD as a modality, that term is used herein to generally refer to any image representing the design data for a specimen in design data space. In other words, in terms of modality, CAD as that term is used herein refers to an image in which features of a device in a design for the device are represented in at least two dimensions as polygons in design data space. A CAD image may therefore be stored in a variety of different file formats and may be generated in a variety of different ways. As long as the CAD modality represents the design data in image format in design data space (as opposed to specimen space for example), the actual file format and generation method is immaterial to the embodiments described herein.

In another embodiment, the first modality includes broadband optical imaging, and the second modality includes SEM. Broadband optical imaging as a modality generally refers to any optical imaging that is performed with broadband (BB) light source such as that generated by a BBP light source described herein. In a further embodiment, the first modality includes broadband optical imaging, and the second modality includes CAD. In an additional embodiment, the first modality includes laser scanning (LS) optical imaging, and the second modality includes broadband optical imaging. LS optical imaging may be performed by the optical imaging systems described herein in which light generated by a laser light source is scanned over a specimen to thereby generate images of the specimen. In some embodiments, the first modality includes LS optical imaging, and the second modality includes CAD. In other embodiments, the first modality includes low resolution optical imaging, and the second modality includes CAD. "Low resolution optical imaging" as described herein generally refers to optical imaging that is performed with a resolution lower than that Which can be achieved by BBP-based optical imaging or other commercially available relatively high resolution optical imaging systems.

The embodiments described herein, therefore, provide a general and robust solution to achieve an extremely high success rate and high ease of use in registering images across modes, pixel sizes, CAD, and platforms. This enables new applications in the semiconductor industry that use data and images across multiple modalities to solve challenging problems. Examples of the different modalities are described above and include SEM to CAD, BB optical imaging to SEM, BB optical to CAD, LS to BB optical, LS to CAD, low resolution optical to CAD, etc. Although some embodiments are described herein with respect to the challenging use case of SEM and CAD registration, the embodiments described herein also provide an efficacious solutions for all of the other different modalities described herein.

The system includes one or more components 100 executed by the one or more computer subsystems (e.g. computer subsystem(s) 102). The one or more components may be executed by the one or more computer subsystems in any suitable manner.

The component(s), e.g., component(s) 100 shown in FIG. 1, executed by the computer subsystem(s), e.g., computer subsystem 36 and/or computer subsystem's) 102, include learning based model 104. The one or more computer subsystems are configured to input the information for the specimen into the learning based model. The computer subsystem(s) may be configured to input the information for the specimen into the learning based model in any suitable manner. The learning based model may include one or more of the different learning based models described herein.

The learning based model is configured for transforming one or more of the at least first and second images to thereby render the at least first and second images into a common space. In one embodiment, the common space is an image space. In another embodiment, the common space is a feature space. In this manner, the embodiments described herein provide training-based approaches (as described further herein) to bring the data and/or images acquired from different modalities into the same space, either image space or feature space, for alignment or "registration" (the terms "alignment" and "registration" are used interchangeably herein). In other words, the one or more components provide a module that uses deep learning technique(s) to robustly solve the multi-modality image registration problem by transforming one or more of these images into a common space, either image space or deep feature space, of a single imaging modality. In particular, most of the differences in images generated by different modalities, especially optical proximity effects, always follow some rules. Therefore, if an algorithm can "learn" these rules, it will be able to somehow invert these rules to remove most of the differences between images acquired with different modalities (e.g., SEM and CAD) and thus make the alignment task much easier.

Although some embodiments are described herein with respect to the SEM to CAD registration problem, as a fully data-driven approach, the embodiments can be applied to any other use cases for multi-modality data and/or image registration. For example, the embodiments described herein generalize to applications such as SEM to CAD, broadband optical imaging to SEM, broadband optical imaging to CAD, LS to broadband optical imaging, LS to CAD, low resolution optical imaging to CAD, etc.

In general, the embodiments described herein use a learning based approach that is generic and can be applied to any imaging mode, imaging tool, and specimen. However, as it is a data-driven method, when it is being applied to specific imaging modes, data may be collected from these imaging modes and the learning based models may be trained with this data. However, in most of the cases, the learning based model does not need to be trained from scratch. Instead, the learning that the model has done can be transferred from different imaging modes to speed up the training process. In the machine learning literature, this is often referred to as fine-tuning or transfer learning.

Figure 2:
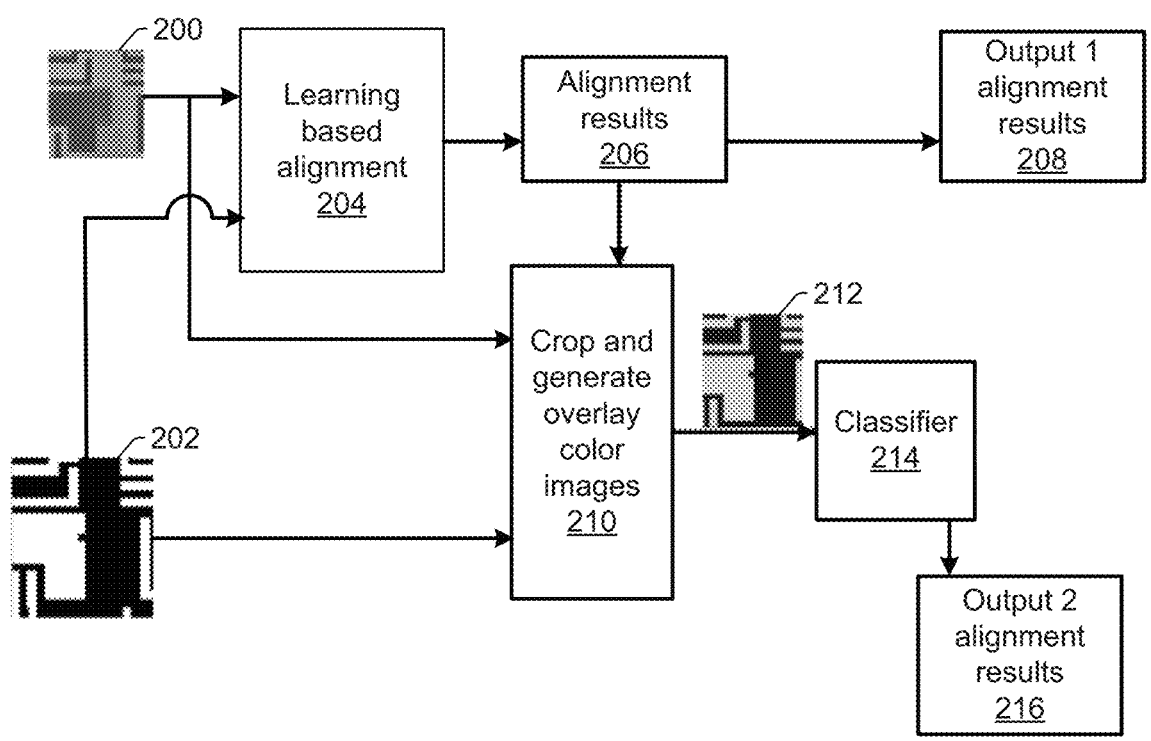
FIGS. 2-3 and 5 are flow charts illustrating embodiments of aligning images for a specimen acquired with different modalities using a learning based model.

FIG. 2 shows an overview of the embodiments described herein for performing learning based multi-modality image registration. In this embodiment, SEM image 200 (a first image generated by a first modality) and CAD 202 (a second image generated by a second modality) are input to learning based alignment 204, which may be performed as described further herein, by the one or more computer subsystems described herein. Learning based alignment 204 may include performing a transformation of one or more of the at least first and second images to thereby render the at least first and second images into a common space, which may be performed as described further herein by one of the learning based models described herein. In addition, learning based alignment 204 includes aligning the at least first and second images to each other after they are rendered into the common space, which may be performed according to any of the embodiments described herein.

Learning based alignment 204 generates alignment results 206, which may include any of the alignment results described herein. The alignment results generated by learning based alignment 204 may be output as output 1 alignment results 208 shown in FIG. 2. These alignment results may include any suitable alignment results known in the art such as alignment offsets, a combination of translation offsets, scales, rotation angles, slant, etc.

The alignment results produced by the learning based alignment along with SEM image 200 and CAD 202 may be input to crop and generate overlay color images step 210, which may be performed as described further herein. Step 210 may generate color overlay image 212, which may be configured as described further herein.

Color overlay image 212 may be input to classifier 214, which may be configured to classify the alignment results into either an alignment class or a misalignment class based on color overlay image 212. For example, the classifier may generate a deep learning based alignment metric based on the color overlay image. In another example, GoogLeNet, a very powerful classification architecture known in the art, can be used for the classification task. GoogLeNet may be trained with two classes: Class 1 can mean the cropped images from different modalities are aligned, and Class 2 can mean they are not aligned. A final SoftMax output corresponding to Class 1 may be used as the alignment confidence. For example, a SoftMax of Class 1 (ranged from 0 to 1) is the confidence of the classifier for the alignment results. In this manner, a SoftMax=0 is not confident while a SoftMax=1 is very confident. In addition, to generate data for the misalignment class, random shift errors may be added to the training data for the alignment class. The classifier may perform such classification as described further herein. Classifier 214 may generate output 2 alignment results 216 that include at least the classification of the alignment results. The output of the classifier may be a probability that the two cropped images are aligned (i.e., the confidence metric of the alignment). Each of the elements and steps described and shown in FIG. 2 may be further configured and performed as described further herein.

The learning based models described herein may be deep learning models, Generally speaking, "deep learning" (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep network, there are many layers between the input and output (and the layers are not made of neurons but it can help to think of it that way), allowing the algorithm to use multiple processing layers, composed of multiple linear and non-linear transformations.

Deep learning is part of a broader family of machine learning methods based on learning representations of data. An observation (e.g., an image) can be represented in many ways such as a vector of intensity values per pixel, or in a more abstract way as a set of edges, regions of particular shape, etc. Some representations are better than others at simplifying the learning task (e.g., face recognition or facial expression recognition). One of the promises of deep learning is replacing handcrafted features with efficient algorithms for unsupervised or semi-supervised feature learning and hierarchical feature extraction.

Research in this area attempts to make better representations and create models to learn these representations from large-scale unlabeled data. Some of the representations are inspired by advances in neuroscience and are loosely based on interpretation of information processing and communication patterns in a nervous system, such as neural coding which attempts to define a relationship between various stimuli and associated neuronal responses in the brain.

Various deep learning architectures such as deep neural networks, convolutional deep neural networks, deep belief networks and recurrent neural networks have been applied to fields like computer vision, automatic speech recognition, natural language processing, audio recognition and bioinformatics where they have been shown to produce state-of-the-art results on various tasks.

The learning based models may also include machine learning models. Machine learning can be generally defined as a type of artificial intelligence (AI) that provides computers with the ability to learn without being explicitly programmed. Machine learning focuses on the development of computer programs that can teach themselves to grow and change when exposed to new data. In other words, machine learning can be defined as the subfield of computer science that "gives computers the ability to learn without being explicitly programmed." Machine learning explores the study and construction of algorithms that can learn from and make predictions on data such algorithms overcome following strictly static program instructions by making data driven predictions or decisions, through building a model from sample inputs.

The machine learning described herein may be further performed as described in "Introduction to Statistical Machine Learning," by Sugiyama, Morgan Kaufmann, 2016, 534 pages; "Discriminative, Generative, and Imitative Learning," Jebara, MIT Thesis, 2002, 212 pages; and "Principles of Data Mining (Adaptive Computation and Machine Learning)," Eland et al., MIT Press, 2001, 578 pages; which are incorporated by reference as if fully set forth herein. The embodiments described herein may be further configured as described in these references.

In a further embodiment, the model is a neural network. For example, the model may be a deep neural network with a set of weights that model the world according to the data that it has been fed to train it. Neural networks can be generally defined as a computational approach Which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In another embodiment, the model is a convolution neural network (CNN). For example, the embodiments described herein can take advantage of deep learning concepts such as a CNN to solve the normally intractable representation conversion problem (e.g., rendering). The model may have any CNN configuration or architecture known in the art. The CNN may also be configured as described in U.S. Patent Application Publication No. 2017/0140524 by Bhaskar et al. published May 18, 2017, which is incorporated by reference as if fully set forth herein. The learning based models described herein may be further configured as described in this patent application.

In some embodiments, the learning based model includes a regression model. In other words, a "regression" model is not one that performs forward simulation or rule-based approaches and, as such, a model of the physics of the processes involved in generating an actual image (for which a simulated image is being generated) is not necessary, Instead, as described further herein, the regression model can be learned (in that its parameters can be learned) based on a suitable training set of data.

In one such embodiment, the regression model includes an autoencoder variant, a conditional generative adversarial network, or a denoise convolutional autoencoder. For example, for learning a transformation under fixed imaging or process parameters as described above, the learning based model may be configured for a regression approach using one or more regression models including autoencoder variations, in which the decoder part will eventually be used for representation conversion, and a conditional generative adversarial network (CGAN), in which the generative part of the CGAN may be used for representation conversion. The embodiments described herein may be further configured as described in this patent application.

An autoencoder, autoassociator or Diabolo network is an artificial neural network used for unsupervised learning of efficient codings. The aim of an autoencoder is to learn a representation (encoding) for a set of data, typically for the purpose of dimensionality reduction. Recently, the autoencoder concept has become more widely used for learning regression models of data. Architecturally, the simplest form of an autoencoder is a feedforward, non-recurrent neural network very similar to the multilayer perceptron (MLP)—having an input layer, an output layer and one or more hidden layers connecting them—, but with the output layer having the same number of nodes as the input layer, and with the purpose of reconstructing its own inputs (instead of predicting the target value given inputs). Therefore, autoencoders are unsupervised learning models. An autoencoder always consists of two parts, the encoder and the decoder. Various techniques exist to prevent autoencoders from learning the identity function and to improve their ability to capture important information and learn richer representations. The autoencoder may include any suitable variant of autoencoder such as a Denoising autoencoder, sparse autoencoder, variational autoencoder, and contractive autoencoder.

In a denoising autoencoder, the input (e.g., SEM) image may be considered as a noisy version of its corresponding (e.g., CAD) image. Denoising autoencoders are generally configured to take a partially corrupted input while training to recover the original undistorted input. This technique has been introduced with a specific approach to good representation. A good representation is one that can be obtained robustly from a corrupted input and that will be useful for recovering the corresponding clean input. This definition contains the following implicit assumptions: The higher level representations are relatively stable and robust to the corruption of the input; and It is necessary to extract features that are useful for representation of the input distribution. A denoise convolutional autoencoder is generally defined as a denoising autoencoder that includes convolutional layers. Denoising autoencoders constructed using convolutional layers have better image denoising performance for their ability to exploit strong spatial correlations. The denoise convolutional autoencoders included in the embodiments described herein may be further configured as described by Gondara in "Medical Image Denoising Using Convolutional Denoising Autoencoders," arXiv:1608.04667v2, Sep. 18, 2016, 6 pages, which is incorporated by reference as if fully set forth herein. The embodiments described herein may be further configured as described in this reference.

Examples of a CGAN are described in "Conditional Generative Adversarial Nets," by Mirza et al., arXiv: 1411.1784, Nov. 6, 2014, 7 pages, which is incorporated by reference as if fully set forth herein. Generative adversarial nets, which may be configured as described in "Generative Adversarial Nets," Goodfellow et al., arXiv:1406.2661, Jun. 10, 2014, 9 pages, which is incorporated by reference as if fully set forth herein, can be extended to a conditional model if both the generator and discriminator are conditioned on some extra information y. y could be any kind of auxiliary information such as class labels or data from other modalities. Conditioning can be performed by feeding y into both the discriminator and generator as an additional input layer.

The embodiments described herein are, however, not based on those described by Mirza in the reference incorporated by reference above. The purpose of the CGANs described by Mirza is different from the embodiments described herein. In the CGANs of Mirza, a distribution is generated but with conditioning. For example, in the inference time, Mirza wants to generate a set of 1000 images but conditioning these images to be only images of dogs, not cats, although when training they may train with images of both dogs and cats. In the embodiments described herein, we want to build a regression (or transformation) model to deterministically transform an image from one domain to another domain. If we ignore the variations in image quality (such as noise, sharpness, non-uniformity, etc.) of the input image, then this transformation will be an 1 to 1 mapping.

In the embodiments described herein, the learning based models are based mostly on those described by Isola et al., in "image-to-Image translation with Conditional Adversarial Net," arXiv:1611.07004v2, Nov. 22, 2017, 17 pages, which is incorporated by reference as if fully set forth herein, with a minor change. However, the purpose of Isola's paper is still to generate a conditional distribution: To generate a conditional distribution, they use drop-out in inference time to add randomness in the generated images. For the embodiments described herein, as we want it to be a deterministic transformation, we disable the drop-out during the inference time to achieve a deterministic transformation.

A deep regression model may be configured to have a deep learning architecture in that the model may include multiple layers, which perform a number of algorithms or transformations. The number of layers on the encoder side of the regression model is use case dependent. In addition, the number of layers on the decoder side is use case dependent and may be dependent on the number of layers on the encoder side. In general, the number of layers on one or both sides of the regression model is not significant and is use case dependent. For practical purposes, a suitable range of layers on both sides is from 2 layers to a few tens of layers.

The one or more components are configured for aligning the at least the first and second images using results of the transforming. The embodiments described herein can perform such aligning in a couple of different ways described further herein. In general, the embodiments can perform the aligning in a non-learning based way using the output of the learning based model. Alternatively, the learning based model can be configured to perform the aligning itself.

In one embodiment, the one or more components are configured for performing the aligning without using a learning based technique. For example, image registration using a deep learning model (or a registration module using deep learning) can be implemented in various ways. In one way, the registration may be deep learning enhanced registration. In this manner, the one or more components may use the output of the learning based model to perform the aligning, but the learning based model itself included in the one or more components is not used for the aligning. In this manner, image registration or alignment can be enhanced or aided by the learning based model, but the image registration or alignment performed using results generated by the learning based model can be performed in any suitable manner. The non-learning based portion of the one or more components configured to perform the alignment using results of the learning based model may include any suitable computer component(s) known in the art.

Figure 3:
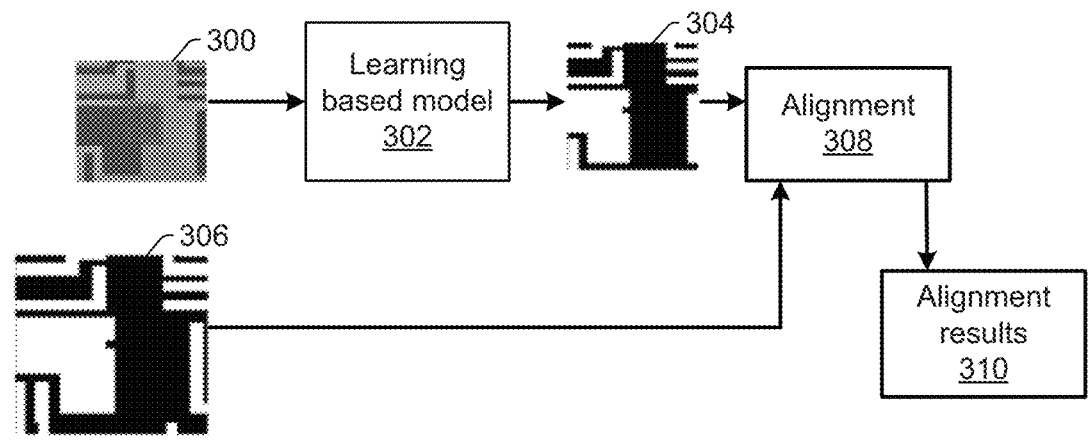

FIG. 3 shows one embodiment of such deep learning enhanced image registration. For this embodiment, the common space is chosen to be the image domain of one of the two input images. For example, the common space may be chosen to be design data or CAD image space, which may be the case if one of the images is a CAD image and the other is transformed to CAD image space. In another example, the common space may be chosen to be SEM image space, which may be the case if one of the images is a SEM image and the other is transformed to the SEM image space. Other common spaces may be chosen for the other image modalities in a similar manner.

As shown in FIG. 3, SEM image 300 (or a first image acquired for a specimen with a first modality) is input to learning based model 302, which transforms the SEM image to thereby render it into the common space of CAD image 306. In other words, learning based model 302 transforms SEM image 300 to rendered image 304 by mapping SEM image 300 from SEM image space to CAD image space. In this manner, the common space in this embodiment is CAD image space. As such, in this embodiment, the second image is the CAD image generated for the specimen with a second modality. Rendered image 304 and CAD image 306 are then input to alignment step 308, which performs alignment or registration of the two images to thereby generate alignment results 310. Since the rendered image and the CAD image now look as if they were acquired from the same modality prior to alignment, alignment can be performed relatively easily as described further herein.

In the embodiment shown in FIG. 3, the learning based model may be a regression model or any of the learning based models described herein. In one such example, the learning based model may be in the form of a deep convolution autoencoder (DCAE). The encoder portion of the learning based model may include, for example, five convolutional layers with kernel sizes of, for example, 5×5, a stride of 2, and no zero padding. Each convolutional layer may be followed by a leaky rectified linear unit. The decoder portion of the learning based model may have a similar architecture as the encoder, but uses deconvolutional layers. The decoder may have separate weights, which are trainable to have more freedom to reconstruct design images. This configuration of the learning based model is non-limiting, however, in that other learning based models may also be used in this embodiment and the parameters of the DCAE described above may be altered as necessary or desired.

To avoid overfitting and reduce redundancy in the extracted features, sparsity in the feature maps may be enforced by using a drop out layer at the end of the encoder and also including a L1 regularization on the codes in the L2 cost function. Again, these specific learning based model configurations are not meant to be limiting to the learning based models that are appropriate for use in the embodiments described herein. The learning based model may vary in type and parameter values from those described above and still be used in the embodiments described herein.

Alignment 308 may be performed with any suitable non-learning based alignment or registration method known in the art such as NCC, sum square difference, etc. Therefore, the embodiments described herein can use a relatively simple alignment method to robustly align the images. In particular, images acquired with different modalities (e.g., a SEM image and a trivially rendered design clip) often look very different from each other due to many factors such as optical proximity errors, missing layers in design (e.g., where a feature in the design (such as a liner) does not appear in an image of the specimen on which the design is formed), various types of noise in the specimen images, or difference in contrast between specimen images and design images. However, as part of the embodiments described herein, a learning based model is used to reconstruct an image in one modality from an image in another modality. The reconstructed image then greatly resembles the corresponding image from the other modality. The alignment results generated by the embodiment shown in FIG. 3 may include any suitable alignment results described herein or known in the art.

The embodiments described herein may or may not be configured for training the learning based model. For example, another method and/or system may be configured to generate a trained learning based model, which can then be accessed and used by the embodiments described herein. In a general training procedure, a training dataset of a tuple of (input, expected output) may be collected based on the use case. The training dataset may be used to train the chosen model. During runtime, the input data may be collected (e.g., under the selected imaging and/or process parameters). The transformation may then be performed using the trained model on the input data.

Figure 4:
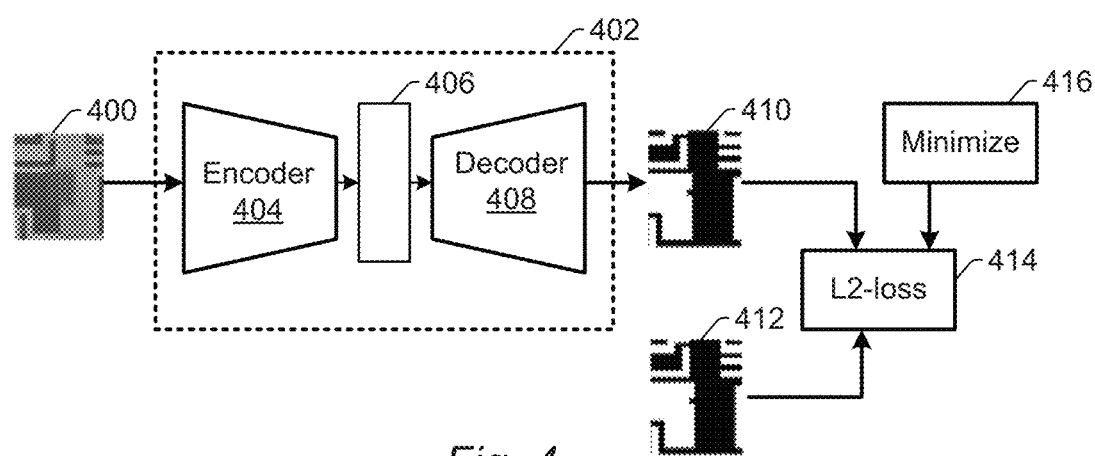
FIGS. 4 and 6-7 are flow charts illustrating embodiments of training various of the learning based models described herein.

The embodiment shown in FIG. 3 shows a run time mode of one of the alignment approaches described herein, FIG. 4 shows one possible method for training such an alignment approach. As shown in FIG. 4, the training may include inputting SEM image 400 into learning based model 402, which may be a regression model or another learning based model described herein. In this embodiment, the learning based model includes encoder 404 and decoder 408, Which may be configured as described further herein. In addition, although an auto-encoder is shown in this figure in the learning based model, any regression model such as CGAN or demise convolutional auto-encoder can be used in the embodiments described herein. Image 400 is input to encoder 404, which determines features 406 (i.e., learning or deep learning based features) of the image. Features 406 are input to decoder 408, which transforms the image into a different space. In this case, the decoder transforms the input SEM image from features 406 to image 410 in design space. In this manner, image 410 may be a CAD image.

Image 410 may be compared to a CAD image known to correspond to image 400. For example, image 410 may be compared to image 412, which may be the CAD image known to correspond to SEM image 400, L2-loss step 414 may then determine differences between the two images, and the differences will be due to errors in parameters of the learning based model. In this manner, minimize step 416 may be performed to minimize the L2-loss step results thereby minimizing errors in the learning based model results and the parameters of the learning based model. For example, the minimize step may include altering one or more parameters of the learning based model until the image generated by the learning based model substantially matches the image corresponding to the input image and/or until the results of the L2-loss step have been minimized. L2-loss step 414 and minimize step 416 may otherwise be performed in any suitable manner known in the art.

The embodiments described above provide a number of differences and improvements compared to the currently used methods. For example, different from the currently used methods that are based on either heuristic renderings or physics-based rendering approaches, the embodiments described above uses a deep regression neural network or other learning based model described further herein trained with pairs of corresponding images from different modalities to transform image 1 to image domain of image 2 for registration, e.g., from SEM to CAD images, from SEM to broadband optical images, etc. No assumptions are made about the imaging systems from which the images are acquired. An advantage of the embodiments described herein is that we can replace the currently used heuristic renderings and hardware-dependent approaches with a data driven-based and hardware-independent approach.

The embodiments described herein are also different from the currently used methods in that they provide flexibility for the user to choose which domain they want to transform the images to. As an example, in SEM-to-CAD registration use cases, instead of transforming CAD to SEM images for registration as in the currently used heuristic and physics based methods, the user can choose to perform transformations in the opposite direction from SEM images back to CAD domain by just swapping the ground truth and the input data during training of the learning based model, No change inside the algorithms is needed. A benefit of this strategy is that images in CAD image domain are much cleaner and sharper than those in SEM domain and thus a simple NCC can align them substantially well.

In another embodiment, the learning based model included in the one or more components is configured for performing the aligning. For example, image registration using a deep learning model (or a registration module using deep learning) can be implemented in various ways. In one way, the registration may be deep learning enhanced end-to-end regression. In this embodiment, a deep learning (DL)-enhanced method can be used to build an end-to-end regression network for multimodality image registration. The common space for the registration now is the feature or deep feature space of one of the two modalities of the input images.

In one such embodiment, the learning based model includes a first encoder into which the first image is input to thereby generate deep learning based features of the first image and a second encoder into which the second image is input to thereby generate deep learning based features of the second image, the first and second encoders are followed by a concatenation layer into which the deep learning based features of the first and second images are input, and the concatenation layer is followed by one or more fully connected layers configured for performing the aligning. In this manner, the embodiments described herein provide a new architecture of an end-to-end regression, which contains two encoders to extract deep features of images from different modalities, respectively, followed by a concat layer and one or more fully connected layers. With the two separate inputs, the new end-to-end regression architecture is able to support registration between images of different sizes.

A concatenation or "concat" layer can be generally defined as a layer that concatenates multiple inputs along a specified axis. A "fully connected layer" may be generally defined as a layer in which each of the nodes is connected to each of the nodes in the previous layer. The fully connected layer(s) may perform classification based on the features extracted by convolutional layer(s) of the encoders, which may be configured as described further herein. The fully connected layer(s) are configured for feature selection and classification. In other words, the fully connected layer(s) select features from a feature map and then classify properties in the image(s) based on the selected features. The selected features may include all of the features in the feature map (if appropriate) or only some of the features in the feature map.

Figure 5:
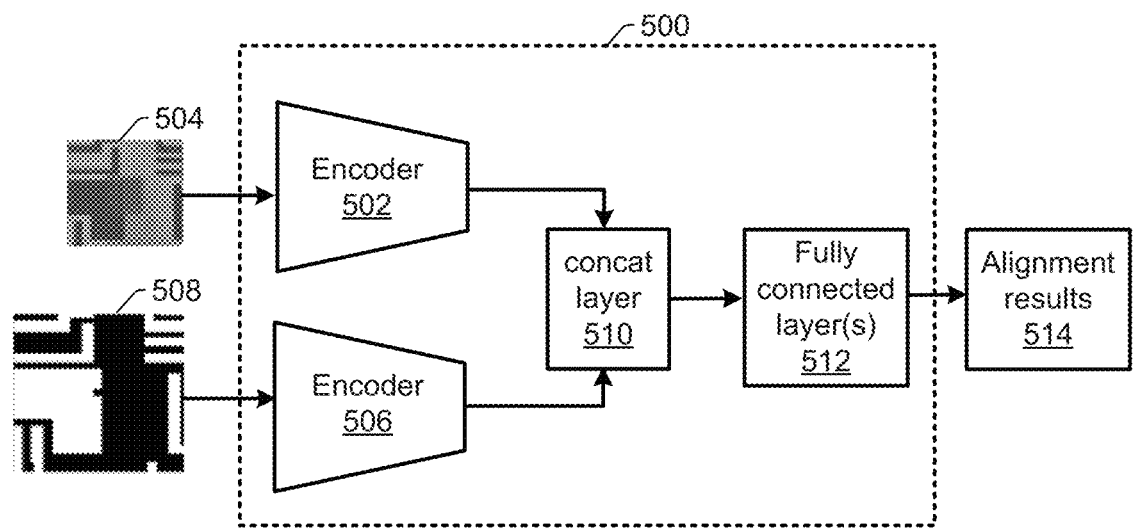

One such embodiment is shown in FIG. 5. As shown in this embodiment, learning based model 500 includes encoders 502 and 506. First image 504 generated by a first modality, in this instance SEM, is input to encoder 502 while second image 508 generated by a second modality different from the first, in this instance CAD, in input to encoder 506. Encoder 502 generates learning based model features (not shown) of image 504 while encoder 506 determines learning based model features (not shown) of image 508. The deep learning based features of the first and second images are input to concatenation (or "concat") layer 510 of the learning based model. The concatenation layer is followed by one or more fully connected layers 512 of the learning based model, into Which the output of the concatenation layer is input and which generate alignment results 514. The concatenation layer and the one or more fully connected layers may be configured as described further herein.

In embodiments described herein in which the feature space is used as the common space for image alignment or registration, the feature space of each imaging modality can be different. It is driven by the data that is used to train the model. The training process will determine what are the best features to describe the images from each image modality (e.g., by minimizing the cost functions). Specifically, the deep features of the first image and the deep features of the second image are two output column vectors from the two encoders shown in FIG. 5. The two feature vectors do not need to have the same dimensions. Also, meanings of elements in each feature vector may be totally different. They are driven by data through the training process.

Figure 6:
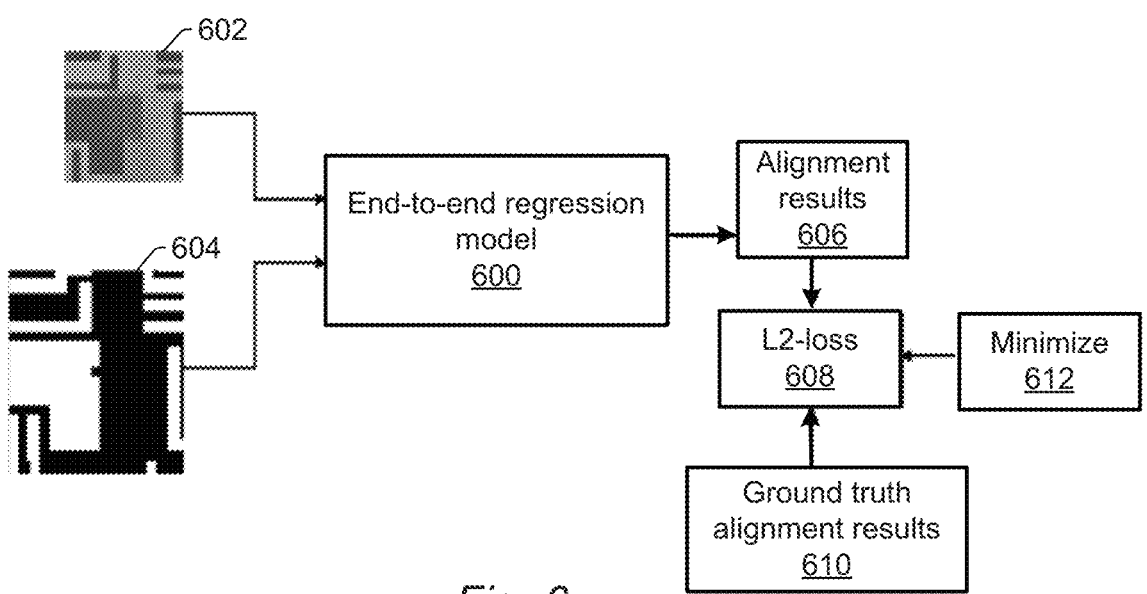

FIG. 6 shows one embodiment for training of the learning based model shown in FIG. 5. For example, as shown in FIG. 6, during training, images 602 and 604 are input to end-to-end regression model 600, which may have the configuration shown in FIG. 5. Image 602 is generated with a first modality, e.g., SEM, and image 604 is generated with a second modality different from the first, e.g., CAD. End-to-end regression model 600 generates alignment results 606 as described further herein, which are input to L2-loss step 608 along with ground truth alignment results 610.

Ground truth alignment results may include alignment results generated for the two images manually, for example, by a user who aligns one image to the other. The ground truth may also be generated by using an alignment algorithm known in the art (heuristic methods or a less robust method) first, then the user can manually verify and/or correct the results. Ground truth data can also be generated by augmentation such as rotating, scaling, translating the images to synthetically generate ground truth data. L2-loss step 608 may be performed as described further herein to determine errors in the alignment results and therefore errors in the learning based model parameters. Training of the learning based model may also include minimize step 612, which may be performed as described further herein to minimize the errors in the alignment results produced by the learning based model and therefore the errors in the parameters of the learning based model.

Figure 7:
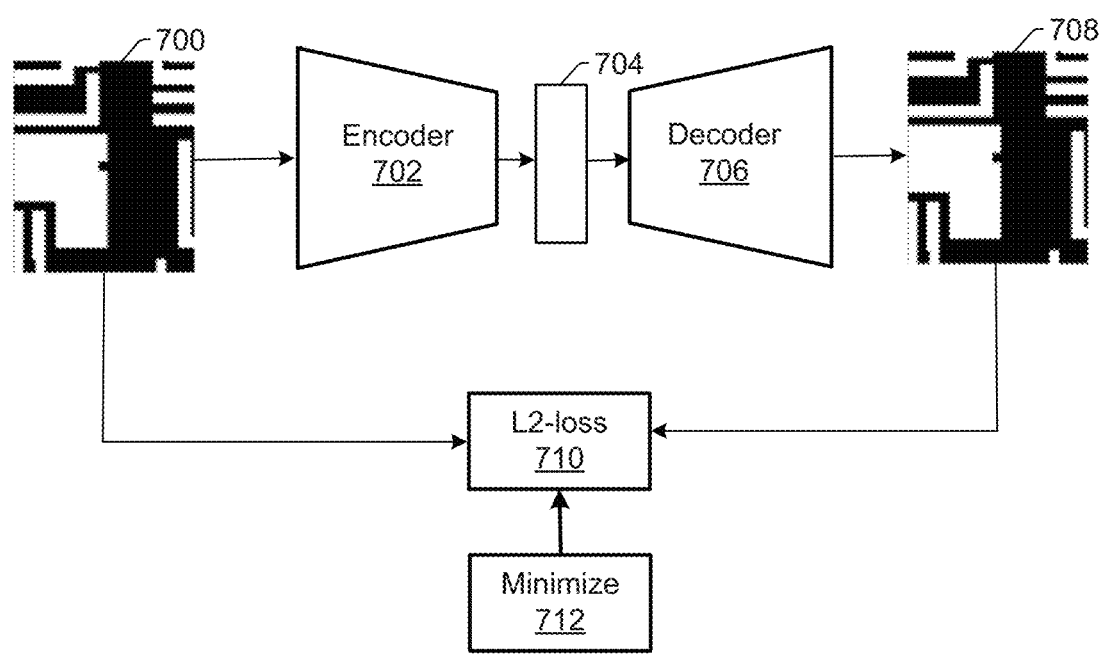

In some such embodiments, one or more of the first and second encoders are pre-trained separately from other layers of the learning based model prior to training of an entirety of the learning based model. In this manner, the embodiments described herein provide a new strategy for pre-training the encoders of the end-to-end regression model. This strategy not only helps the training of the end-to-end regression model be faster hut also provides a method to visually diagnose issues when the registration does not work well. For example, in the embodiment shown in FIG. 5, encoder 502 can be pre-trained in the same way as described above with respect to FIG. 4. Encoder 506 can be pre-trained similarly as shown in FIG. 7. The pre-training strategy not only helps the end-to-end regression training be faster but also provides a visual method to diagnose issues when the registration does not work well.

In one such pre-training strategy, as shown in FIG. 7, image 700 generated for a specimen with one modality, e.g., CAD, may be input to encoder 702. Encoder 702 may generate learning based features 704 for image 700. Features 704 are input to decoder 706, which generates reconstructed image 708. Reconstructed image 708 is meant to be the same as the input image. That is, the encoder determines features for image 700, which are then used by the decoder to reconstruct image 700 thereby generating reconstructed image 708, which if the features are determined properly will be the same as input image 700. Therefore, differences between the input and output images can be used to determine errors in the encoder. For example, the pre-training strategy shown in FIG. 7 may include L2-loss step 710 in which differences between image 700 and reconstructed image 708 are determined. The pre-training strategy may also include minimize step 712 in which attempts to minimize the differences between image 700 and reconstructed image 708 are made by altering one or more parameters of the encoder and then generating a new reconstructed image. L2-loss step 710 and minimize step 712 may be further performed as described herein.

The end-to-end learning based model approaches described herein are different from the currently used methods in that, in these embodiments, the whole registration process is carried out in a single feedforward network. These embodiments therefore are simpler, require fewer parameters to tune, run much faster and thus increase throughput.

The embodiments described herein can also provide new and advantageous data sampling for training. To improve performance of the encoders used in both variants of the learning based model described herein, the embodiments may include a new method for automatically sampling patterned features having certain characteristic(s) for training based on reconstruction errors. For example, in another embodiment, the learning based model includes an encoder, the one or more components include a sampling module (e.g., sampling module 106 shown in FIG. 1) configured for altering initial training data used for training the encoder by: obtaining results of training the encoder performed with the initial training data, determining different errors in the results of the training for patterned features on the specimen having different values of a characteristic of the patterned features, respectively, comparing the different errors in the results of the training for the patterned features having the different values of the characteristic, identifying one or more of the different values of the characteristic of the patterned features corresponding to the largest one or more values of the different errors, and adding additional instances of the patterned features having the identified one or more of the different values to the initial training data to thereby alter the initial training data, and the altered initial training data is used for re-training the encoder. In this manner, the embodiments described herein provide a new framework for iteratively and automatically sampling patterned features having particular characteristics that have relatively high reconstruction errors from the data pool to improve the training of the encoders. The embodiments described herein enable such sampling from the data so that there can be as much variety in pattern shapes and contexts (i.e., layout of structures) as possible in training data.

Figure 8:
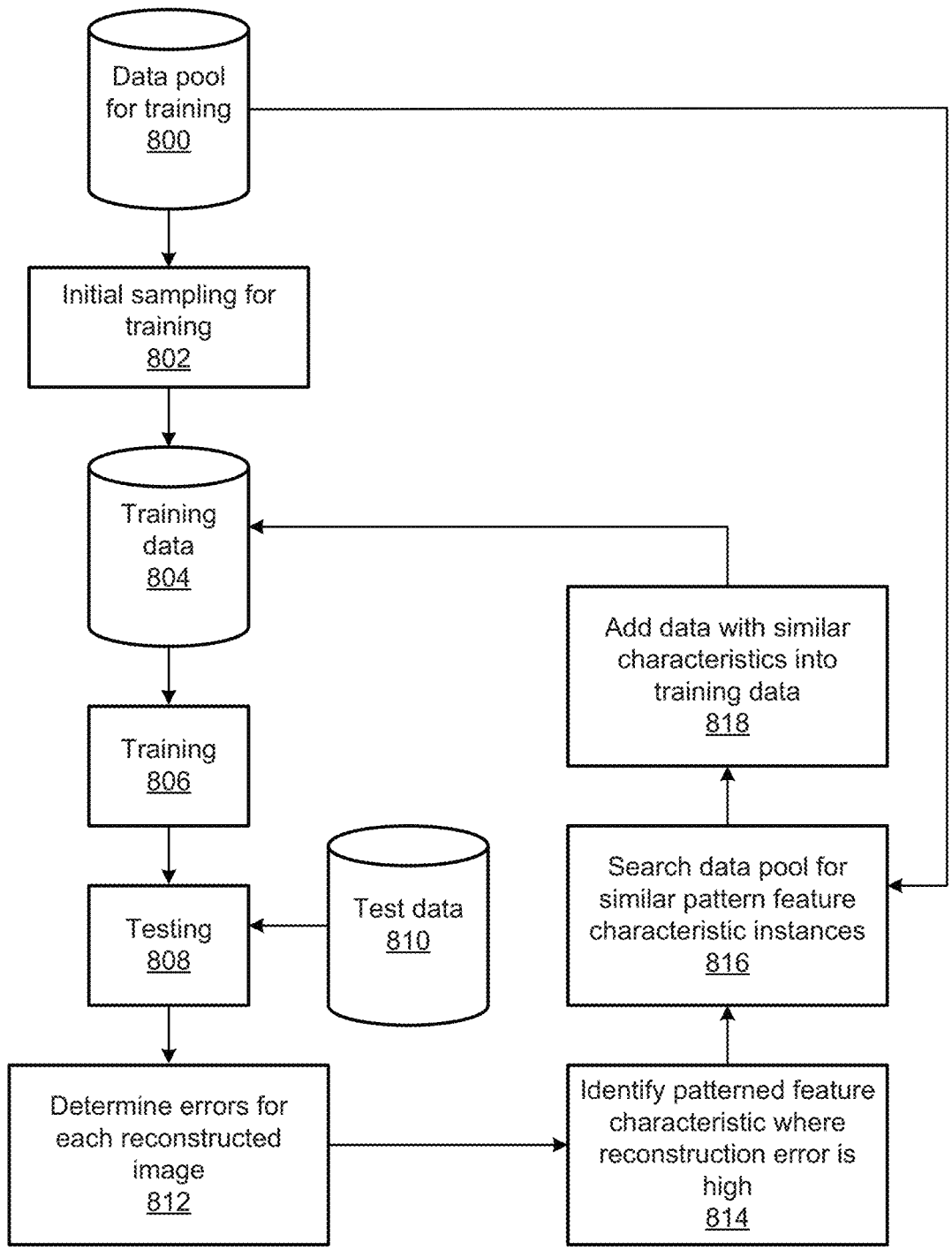
FIG. 8 is a flow chart illustrating an embodiment of altering initial training data used for training an encoder of a learning based model embodiment described herein.

FIG. 8 shows one such embodiment. This embodiment provides an iterative method for automatically sampling data for training based on reconstruction errors. Reconstruction errors are the differences between the reconstructed image and the ground truth. As shown in FIG. 8, data pool for training 800 may be input to initial sampling for training

802. The data pool for training may include any suitable training data known in the art. The initial sampling for training may be performed in any suitable manner known in the art, e.g., manually. The initial sampling step generates training data 804, which is used for training 806 of an encoder of one of the learning based models described herein. Training of the encoder may be performed as described further herein. In another example, training may be performed using an Adam optimization solver with a mini-batch size of 10 and an initial learning rate of 0.01 (although this is just one non-limiting example of how the training may be performed). After training of the encoder of the model, the trained encoder may be tested in testing step 808 performed using test data 810. Test data may include any suitable test data known in the art. For example, the test data may include data in data pool 800 that was not selected to be part of training data 804 by initial sampling step 802. Testing of the trained encoder may be performed in any suitable manner known in the art.

After testing of the trained encoder of the model, the method includes determining errors for each reconstructed image in step 812. The errors for each reconstructed image may be determined as described further herein, e.g., by determining differences between the reconstructed images and ground truth data (such as an image from a different modality known to correspond to the input image) and/or the original image. The method also includes identifying patterned feature characteristic(s) where the reconstruction error is relatively high in step 814. In this manner, a characteristic of the patterned features where reconstruction error is high can be extracted. The characteristic of the patterned features where reconstruction error is high can be any characteristic of the patterned feature that renders it different from other patterned features in the same image and/or in other images used for testing. Examples of such characteristics include, but are not limited to, size, shape, orientation, density, proximity to other features, number of features, and the like.

The method also includes searching the data pool for similar patterned feature characteristic instances in step 816. For example, based on the patterned feature characteristics determined to correspond to relatively high reconstruction errors, the embodiments may search in the data pool for other instances of patterned features having the same or substantially similar characteristics. In one such example, if a patterned feature having a particular shape is determined to correspond to relatively high reconstruction errors, the data pool may be searched for additional examples of instances of patterned features having the same or substantially similar shapes. The method further includes adding data with similar characteristics into the training data in step 818. After step 818 is performed, training data 804, which was previously the initial training data, is now the altered training data since additional training data has been added to the initial training data. The altered training data may be used to re-train the encoder of the learning based model by performing training 806 again with the altered training data. Testing of the encoder of the learning based model as well as other steps shown in FIG. 8 may also be re-performed until the testing shows that the encoder of the learning based model produces no errors, no significant errors, and/or only acceptable errors.

Training the learning based model may be further performed as described in U.S. Patent Application Publication Nos. 2017/0148226 by Zhang et al. published May 25, 2017, and 2017/0193400 by Bhaskar et al. published Jul. 6, 2017, which are incorporated by reference as if fully set forth herein. The embodiments described herein may be further configured as described in these patent applications.

In some embodiments, the one or more components are configured for generating a score for the aligning by: cropping the first and second images using alignment offsets determined by the aligning, stacking the cropped first and second images into first and second color channels, respectively, of a color image to generate a color overlay image, classifying the first and second color channels into alignment and misalignment classes by inputting the color overlay image into a deep neural network trained with alignment and misalignment ground truth data, and determining the score as a probability of the classifying. In this manner, the embodiments described herein may be configured for determining a DL registration or alignment score. In addition, the embodiments provide a new method for objectively and robustly assessing the registration results using a deep learning method.

In the alignment score embodiment described above, different from the currently used approaches which need various heuristic methods to assess the quality of registration results, this embodiment crops the two images using the registration offsets and stacks them into two color channels (say red and green) of an RGB color image to generate a color overlay image. The method then uses a deep neural network trained with alignment and misalignment cases to classify the two color channels, e.g., red and green, into "alignment" and "misalignment" classes. The probability of the classification is employed to serve as the registration score. The deep neural network configured to classify the color channels into misalignment and alignment classes may be any of the learning based models described further herein.

One main advantage of this new registration metric is that the old-heuristic based approach is replaced with a data-driven based approach. The new method is substantially flexible and allows the user to easily train a metric to recognize and assign high registration scores for pairs of images that are visually different but have key features aligned. An example of the use cases for such embodiments is wafer alignment when surrounding patterns of the key features (e.g., B shapes or streets) are substantially different from the template. This is a challenging use case for the currently used heuristics-based registration metrics that require significant algorithm tweaking.

The deep learning registration scores described herein are also totally independent of the registration process and thus they provide a more objective assessment of the registration results. The new method is also generic and can be applied to any image registration use cases.

The embodiments described herein have a number of advantages over currently used methods and systems for image alignment. For example, the embodiments described herein enable new sets of applications that are based on data (images, CAD, etc.) from multiple modalities to solve challenging problems in the semiconductor industry. In particular, multi-modality image registration is substantially important in most current and future applications. Many use cases require success rate of multi-modality image registration to be close to 100%, which is quite challenging with conventional registration methods. The embodiments described herein however are capable of achieving such registration.

Another example of an application of the embodiments described herein is for identifying care areas on a wafer or other specimen. For example, being able to place design-based care areas accurately to +/−1 pixel enables the sensitivity required for next generation nuisance reduction. With feature sizes shrinking, maintaining the same nuisance rate requires smaller care areas for defect of interest (DOI) detection. Further improvement on care area placement accuracy to achieve single pixel is required for next generation optical inspection.

In another example, the embodiments described herein may be particularly useful for multi-modality image registration (e.g., SEM to design (or CAD)) for patterned fidelity measurement (PFM), or metrology), where the characteristic(s) of a patterned feature compared to its as designed corresponding patterned feature are measured. In one such example, images of patterned features on a specimen can be used to measure pattern distortions with respect to design data (e.g., for process window qualification (PWQ), critical dimension uniformity (CDU), etc.). Such applications generally require relatively fine alignment, and the embodiments described herein can provide the required accuracy for such fine alignment.

In an additional example, the embodiments described herein may be particularly useful for multi-modality image registration (e.g., SEM to design (or CAD)) for automatic defect classification (ADC), where the context of a defect in its corresponding design, which can be determined by aligning a defect image to its corresponding design, is useful for classifying the defect. In one such example, ADC performed with design data for a specimen may be performed to distinguish between different defect types lying on different design layers, different structures, P- and N-type defects, etc. Although such applications may only require coarse alignment between defect images and design, the embodiments described herein can provide the appropriate alignment for ADC.

The embodiments described herein may also be used for die-to-database defect detection, in which inspection images are aligned to design data for a specimen so that they can be used in combination to detect defects on the specimen. Such defect detection can provide increased sensitivity to detect pattern defects (e.g., missing patterned features, dummy defects, bridge defects, etc.). Although such applications may only require coarse alignment between defect images and design, the embodiments described herein can provide the appropriate alignment for die-to-database defect detection.

In another example of the advantages of the embodiments described herein, since the embodiments described herein are not heuristic and not hardware dependent, but are data-driven approaches, they do not have any disadvantages of the currently used methods described herein. There is no need to tweak or develop a new algorithm to handle the new challenge. Instead, the user updates the training data and re-trains the learning based model to make it automatically learn how to solve the new challenge. In addition, the embodiments described herein can learn to suppress noise, inverse contrast, and mitigate optical proximity correction (OPC) error. Such capability will reduce a lot of burden on developers for algorithm support which will translate to faster time-to-recipe. In addition, the embodiments described herein are data-driven approaches that can use the most recent advanced deep-learning techniques that have been demonstrated to over-perform traditional image processing and computer vision methods. In an additional example, the embodiments described herein are substantially generic in that they are platform independent. In addition, they can be applied to any use case of multi-modality image registration. In this manner, the multi-modality image registration described herein generalizes to all multi-modality image registration use cases such as SEM to CAD, broadband optical imaging to SEM, broadband optical imaging to CAD, laser scanning to broadband optical imaging, laser scanning to CAD, low resolution optical imaging to CAD, etc. As such, the embodiments described herein enable new possibilities of robustly solving the image registration problem across widely varying modalities and therefore enable new applications in the semiconductor industry. In a further example, the embodiments described herein with deep learning strategies are more robust and require significantly fewer parameters to tune than currently used alignment methods and systems and thus provide higher ease-of-use than currently used alignment methods and systems. In yet another example, the feed forward deep learning based models of the embodiments described herein run faster than existing heuristics rendering approaches and thus will increase throughput.

Each of the embodiments of each of the systems described above may be combined together into one single embodiment.

Another embodiment relates to a computer-implemented method for aligning images for a specimen acquired with different modalities. The method includes acquiring information for a specimen that includes at least first and second images for the specimen. The first image is acquired with a first modality different than a second modality used to acquire the second image. The method also includes inputting the information for the specimen into a learning based model. The learning based model is included in one or more components executed by one or more computer systems. The learning based model is configured for transforming one or more of the at least first and second images to thereby render the at least first and second images into a common space. In addition, the method includes aligning the at least the first and second images using results of the transforming.

Each of the steps of the method may be performed as described further herein. The method may also include any other step(s) that can be performed by the system, computer system(s) or subsystem(s), imaging system(s), component(s), model(s), module(s), etc. described herein. The one or more computer systems, the one or more components, and the model may be configured according to any of the embodiments described herein, e.g., computer subsystem(s) 102, component(s) 100, and model 104. In addition, the method described above may be performed by any of the system embodiments described herein.

Figure 9:
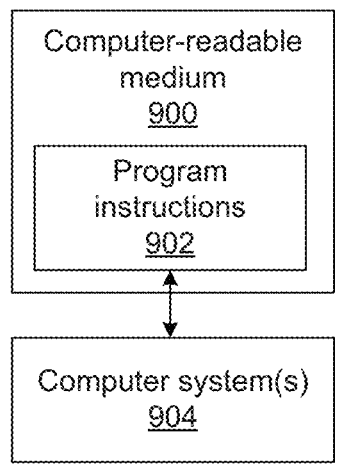
FIG. 9 is a block diagram illustrating one embodiment of a non-transitory computer-readable medium storing program instructions for causing one or more computer systems to perform a computer-implemented method described herein.

An additional embodiment relates to a non-transitory computer-readable medium storing program instructions executable on one or more computer systems for performing a computer-implemented method for aligning images for a specimen acquired with different modalities. One such embodiment is shown in FIG. 9. In particular, as shown in FIG. 9, non-transitory computer-readable medium 900 includes program instructions 902 executable on computer system(s) 904. The computer-implemented method may include any step(s) of any method(s) described herein.

Program instructions 902 implementing methods such as those described herein may be stored on computer-readable medium 900. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, Java- Beans, Microsoft Foundation Classes ("MFC"), SSE (Streaming SIMD Extension) or other technologies or methodologies, as desired.

Computer system(s) 904 may be configured according to any of the embodiments described herein.

Further modifications and alternative embodiments of various aspects of the invention will be apparent to those skilled in the art in view of this description. For example, methods and systems for aligning images for a specimen acquired with different modalities are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to align images for a specimen acquired with different modalities, comprising:
   one or more computer subsystems configured for acquiring information for a specimen, wherein the information comprises at least first and second images for the specimen, wherein the first image is acquired with a first modality different from a second modality used to acquire the second image, and wherein one of the first and second modalities is a modality of an electron beam imaging system configured for generating the first or second images for the specimen by directing electrons to the specimen and detecting electrons from the specimen; and
   one or more components executed by the one or more computer subsystems, wherein the one or more components comprise a learning based model, wherein the one or more computer subsystems are configured to input the information for the specimen into the learning based model, wherein the learning based model is configured for transforming one or more of the at least first and second images to thereby render the at least first and second images into a common space, and wherein the one or more components are configured for aligning the at least the first and second images using results of said transforming.

2. The system of claim 1, wherein the first and second modalities generate the first and second images with different pixel sizes.

3. The system of claim 1, wherein the first and second modalities generate the first and second images with different frequency spreads.

4. The system of claim 1, wherein the first and second modalities generate the first and second images with different distortions of patterned features formed on the specimen.

5. The system of claim 1, wherein the first and second modalities are different modalities of the same imaging system.

6. The system of claim 1, wherein the first and second modalities are different modalities of the same type of imaging system.

7. The system of claim 1, wherein the first and second modalities are modalities of different types of imaging systems.

8. The system of claim 1, wherein the first modality comprises scanning electron microscopy, and wherein the second modality comprises computer aided design.

9. The system of claim 1, wherein the first modality comprises broadband optical imaging, and wherein the second modality comprises scanning electron microscopy.

10. The system of claim 1, wherein the information further comprises at least a third image for the specimen, wherein the third image is acquired with a third modality different from the first and second modalities, wherein the one or more components further comprise an additional learning based model, wherein the additional learning based model is configured for transforming one or more of the at least first, second, and third images to thereby render two or more of the at least first, second, and third images into a common space, wherein the one or more components are further configured for aligning the two or more of the at least first, second, and third images using results of said transforming performed by the additional learning based model, wherein one of the first, second, and third modalities comprises broadband optical imaging, and wherein another of the first, second, and third modalities comprises computer aided design.

11. The system of claim 1, wherein the information further comprises at least a third image for the specimen, wherein the third image is acquired with a third modality different from the first and second modalities, wherein the one or more components further comprise an additional learning based model, wherein the additional learning based model is configured for transforming one or more of the at least first, second, and third images to thereby render two or more of the at least first, second, and third images into a common space, wherein the one or more components are further configured for aligning the two or more of the at least first, second, and third images using results of said transforming performed by the additional learning based model, wherein one of the first, second, and third modalities comprises laser scanning optical imaging, and wherein another of the first, second, and, third modalities comprises broadband optical imaging.

12. The system of claim 1, wherein the information further comprises at least a third image for the specimen, wherein the third image is acquired with a third modality different from the first and second modalities, wherein the one or more components further comprise an additional learning based model, wherein the additional learning based model is configured for transforming one or more of the at least first, second, and third images to thereby render two or more of the at least first, second, and third images into a common space, wherein the one or more components are further configured for aligning the two or more of the at least first, second, and third images using results of said transforming performed by the additional learning based model, wherein one of the first, second, and third modalities comprises laser scanning optical imaging, and wherein another of the first, second, and third modalities comprises computer aided design.

13. The system of claim 1, Wherein the information further comprises at least a third image for the specimen, wherein the third image is acquired with a third modality different from the first and second modalities, wherein the one or more components further comprise an additional learning based model, wherein the additional learning based model is configured for transforming one or more of the at least first, second, and third images to thereby render two or more of the at least first, second, and third images into a common space, wherein the one or more components are further configured for aligning the two or more of the at least first, second, and third images using results of said transforming performed by the additional learning based model, wherein one of the first, second, and third modalities comprises low resolution optical imaging, and wherein another of the first, second, and third modalities comprises computer aided design.

14. The system of claim 1, wherein the common space is an image space.

15. The system of claim 1, wherein the common space is a feature space.

16. The system of claim 1, wherein the one or more components are further configured for performing said aligning without using a learning based technique.

17. The system of claim 1, wherein the learning based model comprises a regression model.

18. The system of claim 17, wherein the regression model comprises an autoencoder variant, a conditional generative adversarial network, or a denoise convolutional autoencoder.

19. The system of claim 1, wherein the learning based model included in the one or more components is further configured for performing said aligning.

20. The system of claim 19, wherein the learning based model comprises a first encoder into which the first image is input to thereby generate deep learning based features of the first image and a second encoder into which the second image is input to thereby generate deep learning based features of the second image, wherein the first and second encoders are followed by a concatenation layer into which the deep learning based features of the first and second images are input, and wherein the concatenation layer is followed by one or more fully, connected layers configured for performing said aligning.

21. The system of claim 20, wherein one or more of the first and second encoders are pre-trained separately from other layers of the learning based model prior to training of an entirety of the learning based model.

22. The system of claim 1, wherein the learning based model comprises an encoder, wherein the one or more components further comprise a sampling module configured for altering initial training data used for training the encoder by: obtaining results of training the encoder performed with the initial training data, determining different errors in the results of the training for patterned features on the specimen having different values of a characteristic of the patterned features, comparing the different errors in the results of the training for the patterned features having the different values of the characteristic, identifying one or more of the different values of the characteristic of the patterned features corresponding to the largest one or more values of the different errors, and adding additional instances of the patterned features having the identified one or more of the different values to the initial training data to thereby alter the initial training data, and wherein the altered initial training data is used for re-training the encoder.

23. The system of claim 1, wherein the one or more components are further configured for generating a score for said aligning by: cropping the first and second images using alignment offsets determined by said aligning, stacking the cropped first and second images into first and second color channels, respectively, of a color image to generate a color overlay image, classifying the first and second color channels into alignment and misalignment classes by inputting the color overlay image into a deep neural network trained with alignment and misalignment ground truth data, and determining the score as a probability of said classifying.

24. A non-transitory computer-readable medium, storing program instructions executable on one or more computer systems for performing a computer-implemented method for aligning images for a specimen acquired with different modalities, wherein the computer-implemented method comprises:
acquiring information for a specimen, wherein the information comprises at least first and second images for the specimen, wherein the first image is acquired with a first modality different than a second modality used to acquire the second image, and wherein one of the first and second modalities is a modality of an electron beam imaging system configured for generating the first or second images for the specimen by directing electrons to the specimen and detecting electrons from the specimen;
inputting the information for the specimen into a learning based model, wherein the learning based model is included in one or more components executed by the one or more computer systems, and wherein the learning based model is configured for transforming one or more of the at least first and second images to thereby render the at least first and second images into a common space; and
aligning the at least the first and second images using results of said transforming.

25. A computer-implemented method for aligning images for a specimen acquired with different modalities, comprising:
acquiring information for a specimen, wherein the information comprises at least first and second images for the specimen, wherein the first image is acquired with a first modality different than a second modality used to acquire the second image, and wherein one of the first and second modalities is a modality of an electron beam imaging system configured for generating the first or second images for the specimen by directing electrons to the specimen and detecting electrons from the specimen;
inputting the information for the specimen into a learning based model, wherein the learning based model is included in one or more components executed by one or more computer systems, and wherein the learning based model is configured for transforming one or more of the at least first and second images to thereby render the at least first and second images into a common space; and
aligning the at least the first and second images using results of said transforming.

* * * * *